United States Patent [19]

Shiraishi et al.

[11] Patent Number: 5,872,023
[45] Date of Patent: Feb. 16, 1999

[54] METHOD OF FABRICATING OF LIGHT EMITTING DEVICE WITH CONTROLLED LATTICE MISMATCH

[75] Inventors: Masashi Shiraishi; Satoshi Ito, both of Kanagawa; Kazushi Nakano, Tokyo; Akira Ishibashi, Kanagawa; Masao Ikeda, Kanagawa; Hiroyuki Okuyama, Kanagawa; Katsuhiro Akimoto, Kanagawa; Tomonori Hino, Kanagawa; Masakazu Ukita, Kanagawa, all of Japan

[73] Assignee: Sony Corporation, Tokyo, Japan

[21] Appl. No.: 829,214

[22] Filed: Mar. 31, 1997

Related U.S. Application Data

[63] Continuation of Ser. No. 570,376, Dec. 11, 1995, Pat. No. 5,633,514, which is a continuation of Ser. No. 299,655, Sep. 2, 1994, abandoned.

[30] Foreign Application Priority Data

| Sep. 7, 1993 | [JP] | Japan | 5-222566 |
| Feb. 9, 1994 | [JP] | Japan | 6-015523 |
| May 9, 1994 | [JP] | Japan | 6-095097 |

[51] Int. Cl.$^6$ ........................................................ H01S 3/19
[52] U.S. Cl. ................................................ 438/46; 438/22
[58] Field of Search ........................... 438/22, 938, 46; 117/89; 257/190; 372/45

[56] References Cited

U.S. PATENT DOCUMENTS

| 4,806,996 | 2/1989 | Luryi ........................................ 257/190 |
| 5,081,632 | 1/1992 | Migita et al. . |
| 5,091,333 | 2/1992 | Fan et al. .................................. 117/89 |
| 5,268,918 | 12/1993 | Akimoto et al. ........................ 372/45 |
| 5,291,507 | 3/1994 | Haase et al. . |
| 5,299,217 | 3/1994 | Migita et al. . |

FOREIGN PATENT DOCUMENTS

402194564  8/1990  Japan .

OTHER PUBLICATIONS

M. Ilegems, "Properties of III–V Layers", in The Physics and Technology of Molecular Beam Epitaxy edited by E. Parker, Plenum Press, pp. 86–89 (no month given), 1985.

L. Esaki, "Compositional Superlattices", in The Physics and Technology of Molecular Beam Epitaxy edited by E. Parker, Plenum Press, p. 179 (no month given), 1985.

T. Yao, "MBE of II–VI Compounds", in The Physics and Technology of Molecular Beam Epitaxy edited by E. Parker, Plenum Press, p. 341 (no month given), 1985.

*Primary Examiner*—Charles Bowers
*Assistant Examiner*—Keith Christianson
*Attorney, Agent, or Firm*—Hill & Simpson

[57] ABSTRACT

The semiconductor light emitting device includes a semiconductor substrate (1), a first conductivity type first cladding layer (2) deposited on the semiconductor substrate (1), an active layer (4) deposited on the first cladding layer (2), and the second conductivity type second cladding layer (6) deposited on the active layer (4). The first and the second cladding layers (2, 6) are made of the II/VI-compound semiconductors including at least one kind of II group elements such as Zn, Hg, Cd, Mg and at least one kind of VI group elements such as S, Se, Te. The lattice mismatching $\Delta a/a$ (%) between at least one of the first cladding layer (2) and the second cladding layer (6) and the substrate is set within the range of $-0.9\% \leq \Delta a/a \leq 0.5\%$ (reference symbols a and $a_c$ represent the lattice constant of the semiconductor substrate and the lattice constant of at least either of the first and second cladding layers, and $\Delta a$ is obtained from $\Delta a = a_c - a$).

2 Claims, 8 Drawing Sheets

METHOD OF FABRICATING OF LIGHT EMITTING DEVICE WITH CONTROLLED LATTICE MISMATCH

This is a continuation of application Ser. No. 08/570,376 filed Dec. 11, 1995. U.S. Pat. No. 5,633,514, which is a cont. of Ser. No. 299,655 filed Sep. 2, 1994, now abandoned.

BACKGROUND OF THE INVENTION

1. Fields of the Invention

The present invention relates to a semiconductor light emitting device in which at least an active layer and a cladding layer on a substrate are made of II/VI-compound semiconductors.

2. Related Art

Since it is requested that an optical disc and a magneto-optical disc is recorded and/or reproduced with high density and high resolution, a demand for a semiconductor laser which emits green or blue laser light is more and more increased.

II/VI-compound semiconductors made of II group elements such as Zn, Hg, Cd, Mg and VI group elements such as S, Se, Te are promising as materials to form semiconductor light emitting devices such as the semiconductor lasers, light emitting diodes or the like. In particular, ZnMgSSe mixed crystal can be grown on a GaAs substrate and is suitable for a guiding layer and a cladding layer used when a blue semiconductor laser is fabricated (see "Electronics Letters 28 (1992) p. 1798").

When this kind of a II/VI-compound semiconductor light emitting device such as ZngSSe compound semiconductor is formed as the cladding layer, the GaAs substrate and the ZnSe substrate are used as semiconductor substrate on which the cladding layer and the active layer are epitaxially grown because they are excellent in crystallinity and are now commercially available on the market. In this case, in order that the semiconductor light emitting device can emit laser light with a desired short wavelength highly efficiently, the cladding layer that is eptaxially grown on the GaAs substrate directly or via a buffer layer should be formed as a compound semiconductor layer with an excellent crystallinity.

Therefore, semiconductor light emitting devices have hitherto been considered that a lattice constant of the cladding layer is strictly agreed with that of the GaAs substrate. For this reason, values x and values y of $Zn_xMg_{1-x}S_ySe_{1-y}$ cladding layer should be selected very strictly so that compositions cannot be selected substantially with freedom and that composition should be selected strictly. Thus, the semiconductor light emitting devices cannot be fabricated satisfactorily.

Moreover, in the II/VI-compound semiconductor light emitting devices, a p-type electrode obtained when a semiconductor laser using an electrode formed on the opposite side of the substrate, particularly, n-type substrate is fabricated generates much heat and luminous intensity is therefore deteriorated.

SUMMARY OF THE INVENTION

An object of the present invention is to allow a continuous oscillation of a laser with a smaller threshold value by solving problems such as deterioration in luminous intensity of a laser diode or a light emitting diode caused when they are made of such II/VI-compound semiconductor.

Another object of the present invention is to fabricate a semiconductor light emitting device advantageously by selecting composition thereof more freely on the basis of a measured tolerance of a lattice mismatching presented by a cladding layer relative to a GaAs or ZnSe substrate.

According to a first aspect of the present invention, a semiconductor light emitting device comprises a semiconductor substrate, a first conductivity type first cladding layer deposited on the semiconductor substrate, an active layer deposited on the first cladding layer and a second conductivity type second cladding layer deposited on the active layer, wherein the first cladding layer and the second cladding layer are made of the II/VI-compound semiconductors including at least one element of II group elements such as Zn, Hg, Cd and Mg and at least one element of VI group elements such as S, Se and Te and a lattice mismatching presented by at least one of the first cladding layer and the second cladding layer relative to the substrate is set within the range of $-0.9\% \leq \Delta a/a \leq 0.5\%$.

According to a second aspect of the present invention, the semiconductor light emitting element comprises the semiconductor substrate, the first conductivity type first cladding layer deposited on the semiconductor substrate, the active layer deposited on the first cladding layer and the second conductivity type second cladding layer deposited on the active layer, wherein the first cladding layer and the second cladding layer are made of the II/VI-compound semiconductors including at least one element of the II group elements such as Zn, Hg, Cd and Mg and at least one element of the VI group element such as S, Se and Te and a lattice constant of the second cladding layer deposited on the opposite side of the substrate relative to the active layer is set smaller than a lattice constant of the first cladding layer.

According to the present invention, the semiconductor light emitting device can be continuously oscillated when a value of the lattice mismatching $\Delta a/a$ determined from a ratio of an amount $\Delta a$ of difference at room temperature between the lattice constant of the cladding layer and a lattice constant a of the substrate to the lattice constant a of the substrate is set within the range from $-0.9\%$ to $0.5\%$ on the basis of measured results thereof.

When the difference amount $\Delta a$ is set smaller than 0 by setting a value of the lattice mismatching $\Delta a/a$ smaller than 0%, the semiconductor light emitting device can be oscillated at a lower threshold value. Therefore, oscillation thereof at the lower threshold can suppress generation of heat at an electrode and can also suppress deterioration of the luminous efficiency and deterioration of the semiconductor light emitting device itself.

It is also confirmed that the semiconductor light emitting device can have excellent optical characteristics when the lattice mismatching $\Delta a/a$ presented by the first cladding layer formed on the semiconductor substrate relative to the semiconductor substrate is set within the range between $\pm 0.5\%$. In this case, an amount of light emitted from a deep level and the number of non-luminescent centers are reduced, so that the light can be emitted from a band edge more efficiently.

When the lattice mismatching $\Delta a/a$ presented by a the first cladding layer relative to the semiconductor substrate is set to $\Delta a/a = -0.06\%$, the lattices of the first cladding layer and the semiconductor substrate can be matched with each other at growth temperature because of difference in thermal expansion coefficient between the substrate and eptaxially grown layers. Therefore, the lattice mismatching $\Delta a/a$ according to the present invention is set within the range of $-0.4\% \leq \Delta a/a < 0\%$, that is, the range in which $\Delta a/a = -0.06\%$ is included and characteristics of the semiconductor light emitting device is satisfactory.

The similar effects as described above can be obtained from the semiconductor light emitting device with an SCH (Separate Confinement Heterostructure) in which first and second guiding layers are respectively provided between the first and second cladding layers and the active layer in addition to the structure according to the first aspect of the present invention.

Luminous characteristics of a well layer relative to a carrier of the active layer can be improved and further the light emitting device having excellent characteristics can be obtained because of the SCH in which the lattice mismatching $\Delta a/a$ of the first cladding layer and the guiding layer formed on the semiconductor substrate relative to the semiconductor substrate is set within the range of $-0.1\% \leq \Delta a/a < 0\%$.

Moreover, the lattice constant of the second cladding layer deposited on the opposite side of the substrate relative to the active layer is set smaller than the lattice constant of the first cladding layer. Then, generation of heat at the portion where the electrode is deposited expands lattices at the portion at a temperature at which the semiconductor light emitting device is oscillated, whereby the lattice constant of the second cladding layer can approximate the lattice constant of the first cladding layer. Therefore, strain between the first and second cladding layers can be relaxed. Such deterioration of the semiconductor light emitting device can be suppressed, and life thereof can be more extended.

DESCRIPTION OF THE PREFERRED EMBODIMENTS

Embodiments of the present invention will hereinafter be described in detail with reference to the drawings. In this embodiment, a green or blue semiconductor laser is composed of a GaAs substrate, a ZnMgSSe cladding layer and an ZnCdSe active layer formed on the GaAs substrate.

Figure 2:
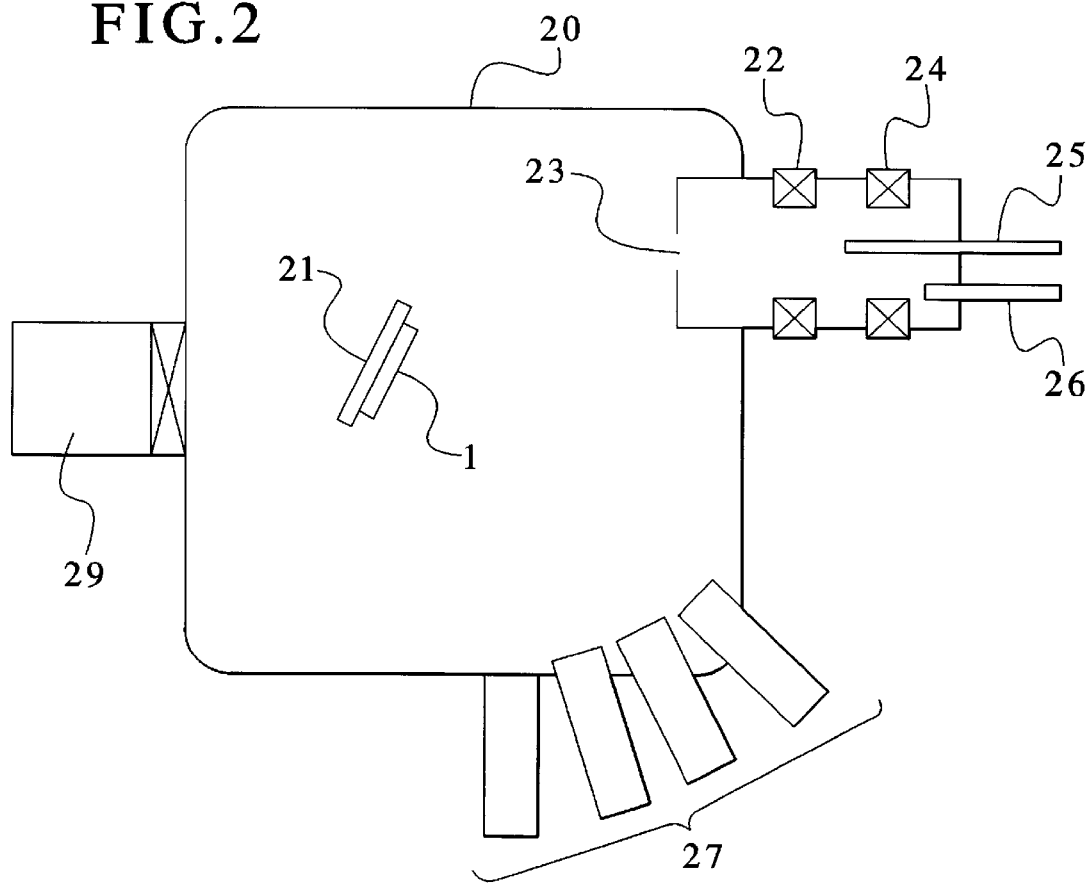
FIG. 2 is a diagram used to explain an example of a crystal growth apparatus.

Initially, the layers of respective examples were grown by a molecular beam epitaxy crystal growth apparatus shown in FIG. 2. As shown in FIG. 2, the crystal growth apparatus includes a vacuum vessel 20 housing a substrate holder 21 on which is a substrate 1 is fixed. An ECR (electron cyclotron resonance) cell 22 and a molecular beam source 27, i.e., a so-called K cell are opposed to a surface of the substrate 1. The ECR cell 22 includes a magnet 24 and is connected with a microwave terminal 25 and a conduit 26 introducing proper gas, such as nitrogen gas or the like into the vacuum vessel 20. The nitrogen gas is introduced into the vacuum vessel 20 through a gas introducing inlet 23 as p-type impurities. Reference numeral 29 represents a space chamber.

Figure 1:
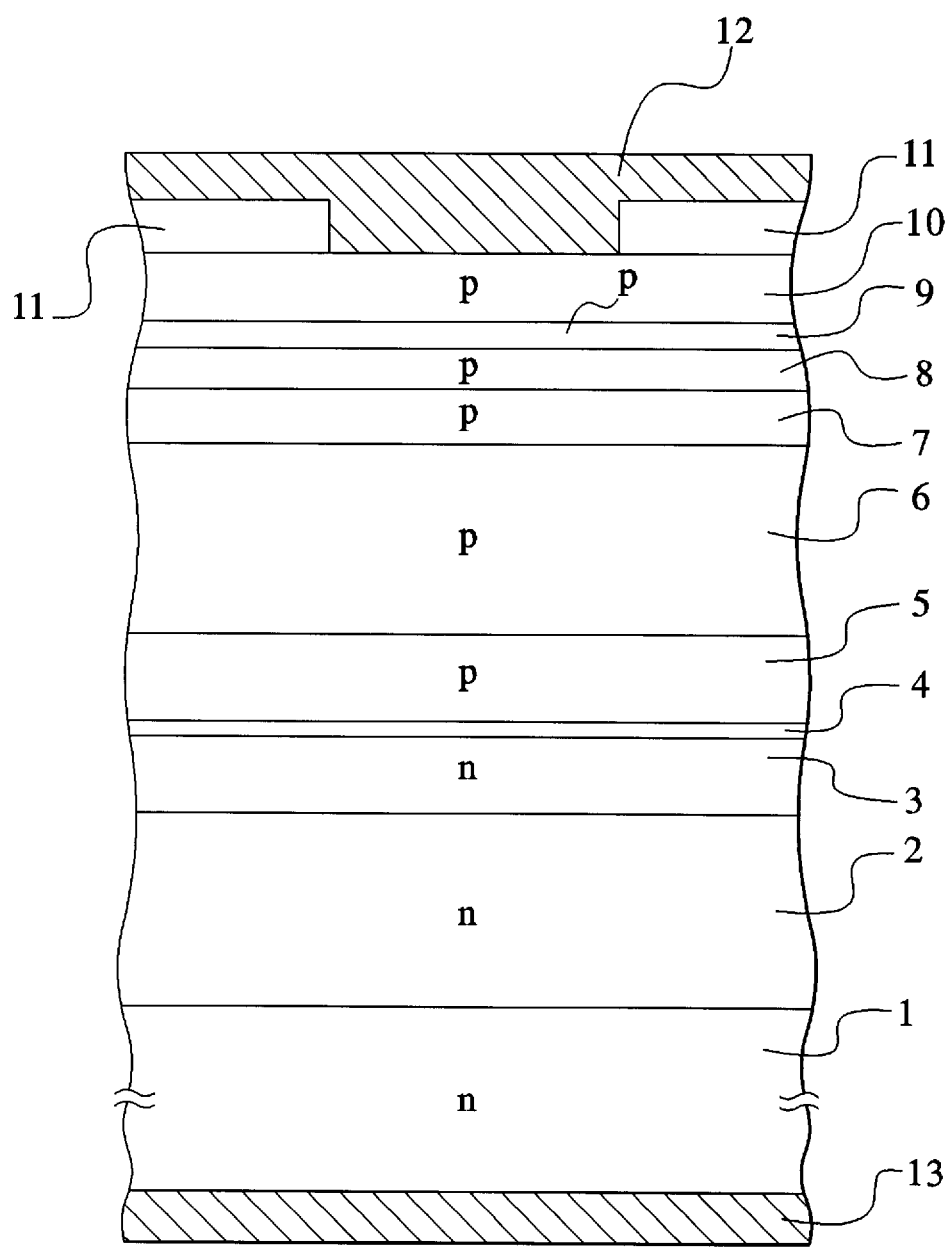
FIG. 1 is a schematically enlarged cross-sectional view of a light emitting device according to an embodiment of the present invention.

A semiconductor light emitting device was fabricated by using the apparatus shown in FIG. 1, and materials and thicknesses of respective layers are as follows:

| LAYERS | MATERIALS | THICKNESSES |
| --- | --- | --- |
| substrate 1 | n-type GaAs | |
| first cladding layer 2 | n-type ZnMgSSe | 700 nm |
| first guide layer 3 | ZnSSe | 60 nm |
| active layer 4 | ZnCdSe | 6 to 12 nm |
| second guide layer 5 | ZnSSe | 60 nm |
| second cladding layer 6 | p-type ZnMgSSe | 500 nm |
| first semiconductor layer 7 | p-type ZnSSe layer | 500 nm |
| second semiconductor layer 8 | p-type ZnSe layer | 100 nm |
| super-lattice semiconductor layer 9 | ZnSe/ZnTe | |
| contact layer 10 | p-type ZnTe | 100 nm |

In the above structure, n-type and p-type impurities were Cl and N, respectively.

An insulating layer 11 made of a material such as polyimide or the like is deposited on the contact layer 10. Then, a current flowing portion, i.e., striped pattern opening extended in the direction perpendicular to the sheet of drawing of FIG. 1 is formed by photolithography. Subsequently, Pd, Pt, Au are successively laminated on the whole surface from the contact layer 10 side by some suitable means such as a sputtering or the like and a p-electrode 12 is formed on a contact layer 10 through the opening of the insulating layer 11 in ohmic contact. An electrode 13 made of material such as In or the like also is deposited on the rear-surface of the substrate 1, thereby the semiconductor light emitting device being fabricated.

Figure 3:
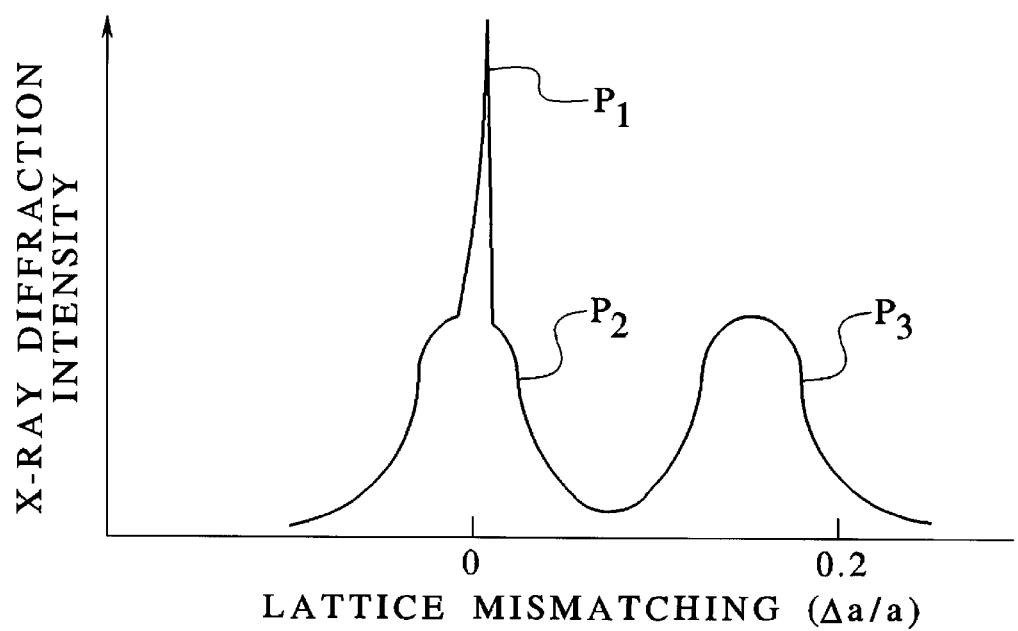
FIG. 3 is a diagram showing an X-ray diffraction profile.

FIG. 3 shows a profile obtained when the thus fabricated semiconductor laser is examined by an X-ray double crystal method. In FIG. 3, a horizontal axis represents a lattice mismatching $\Delta a/a$ obtained at room temperature. In FIG. 3, zero assumes a reference position of the same lattice constant as that of the GaAs substrate 1. The positive side indicates that the lattice constant becomes small, and the negative side indicates that the lattice constant becomes large. The substrate 1 has a peak P1, and the first conductivity type, i.e., n-type first cladding layer 2 has a peak 2 on the side slightly deviated to the negative side. The second conductivity type, i.e., second cladding layer 6 has a peak 3 on the side deviated to the positive side. The profile shown in FIG. 3 is obtained when the lattice constant of the p-type second cladding layer 6 is made small as compared with that of the substrate 1 and also made small as compared with that of the first cladding layer 2 on the substrate side.

The following table 1 shows measured results of a current threshold density Jth, an energy band gap Eg of the active layer, a lattice mismatching $\Delta a/a$ presented by p-type cladding layer 2 at room temperature (300K) relative to the substrate, a lattice mismatching Δa/a presented by the p-type cladding layer 6 at room temperature relative to the substrate, and further the oscillated situation of the semiconductor light emitting device at room temperature according to the respective inventive examples and comparative examples.

TABLE 1

|  | current threshold density Jth[mA] | active layer Eg[eV] | p-type cladding layer Δa/a[%] | n-type cladding layer Δa/a[%] | oscillated situation (room temperature) |
|---|---|---|---|---|---|
| inventive example 1 | 80 | 2.51 | −0.45 | −0.54 | continuous |
| inventive example 2 | 450 | 2.56 | +0.37 | −0.37 | pulse |
| inventive example 3 | 320 | 2.48 | +0.41 | −0.70 | pulse |
| inventive example 4 | 550 | 2.56 | +0.45 | −0.75 | pulse |
| inventive example 5 | 1500 | 2.62 | +0.15 | +0.39 | pulse |
| inventive example 6 | 700 | 2.65 | −0.88 | −0.73 | pulse |
| inventive example 7 | 420 | 2.62 | +0.37 | −0.22 | pulse |
| comparative example 1 | — | 2.58 | +0.43 | −0.93 | X |
| comparative example 2 | — | 2.64 | −0.59 | −1.06 | X |

The following table 2 shows measured results of the oscillated situation of the semiconductor light emitting device obtained when a Zn composition ratio x and a S composition ratio y are varied in $Zn_xMg_{1-x}S_ySe_{1-y}$ composition of the n-type cladding layer 2. The composition ratios x, y were selected so as to approximate composition ratios x=0.92, y=0.15, respectively. Therefore, the composition ratios x, y can be selected in a range of about ±0.03 and ±0.01 with respect to the above composition ratios x=0.92, y=0.15, respectively.

TABLE 2

|  | Zn composition ratio x | S composition ratio y | oscillated situation (room temperature) |
|---|---|---|---|
| inventive example 1 | 0.96 | 0.18 | continuous |
| inventive example 2 | 0.94 | 0.19 | pulse |
| inventive example 3 | 0.97 | 0.20 | pulse |
| inventive example 4 | 0.93 | 0.25 | pulse |
| inventive example 5 | 0.90 | 0.08 | pulse |
| inventive example 6 | 0.91 | 0.18 | pulse |
| inventive example 7 | 0.96 | 0.22 | pulse |
| comparative example 1 | 0.97 | 0.20 | X |
| comparative example 2 | 0.92 | 0.11 | X |

Study of measured results shown in Table 1 reveals that the semiconductor light emitting device can be oscillated continuously or in a pulse fashion when the lattice mismatching Δa/a presented by the cladding layer, more particularly, the p-type cladding layer relative to the substrate is selected substantially in a range of −0.9%≦Δa/a≦0.5%.

Figure 4:
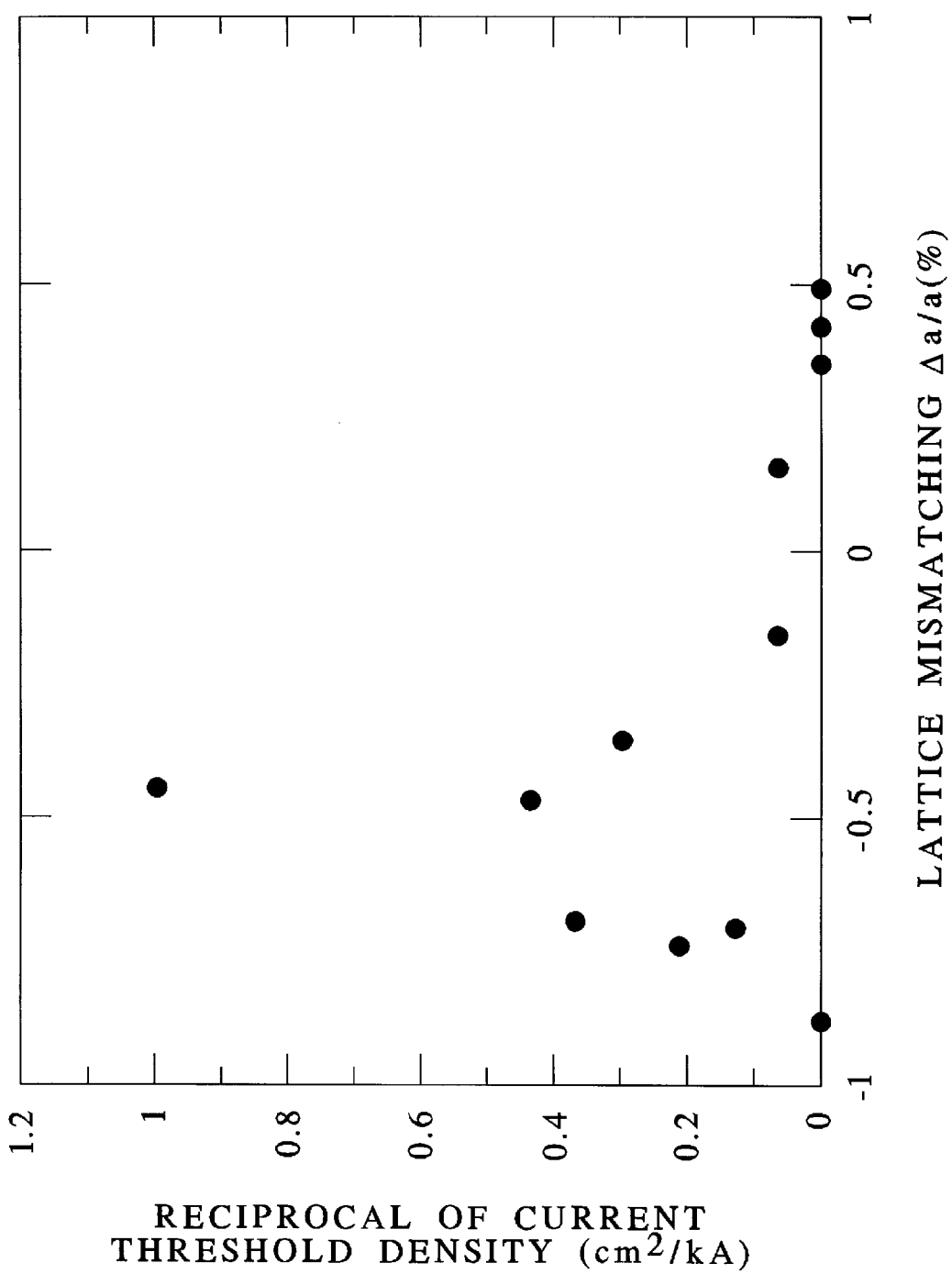
FIG. 4 is a diagram showing an oscillation state relative to a lattice mismatching.

FIG. 4 shows, including the measured results shown in Table 1, measured results of the oscillated situation obtained when reciprocals of the current threshold density Jth are plotted with respect to the lattice mismatching Δa/a in the semiconductor lasers having structures similar to those of the above examples. Values of the lattice mismatching Δa/a shown in FIG. 4 are those of the lattice mismatching Δa/a presented by the cladding layer in which X-ray diffraction intensity becomes maximum as shown in FIG. 3. As understood from FIG. 4, it is desirable in view of qualitative aspect to make the lattice constant of the cladding layer small as compared with that of the substrate when a lower oscillation threshold value is demanded.

Figure 5:
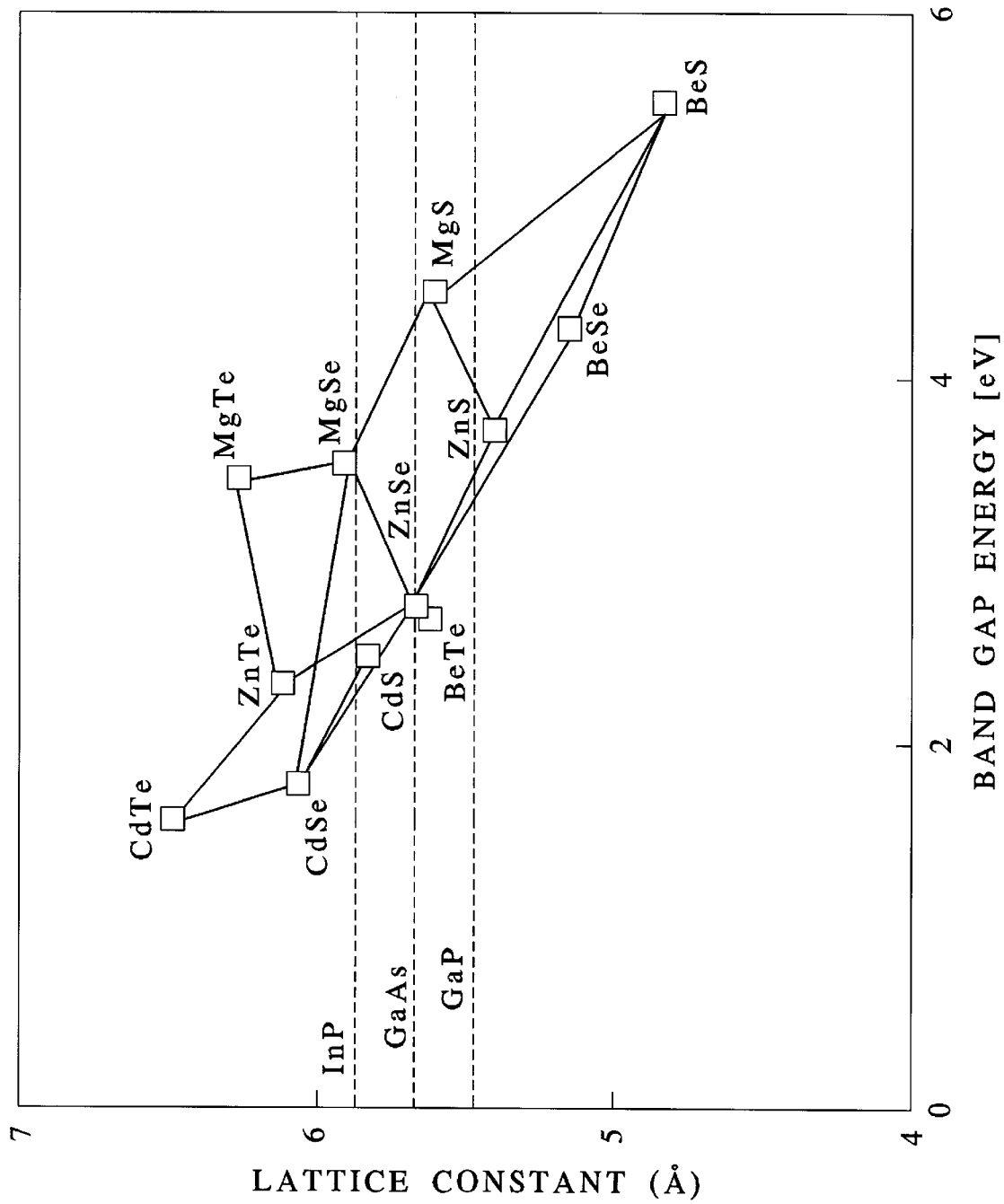
FIG. 5 is a diagram showing a lattice constant of a II/VI-compound semiconductor.

As understood from FIG. 5 which shows lattice constants of II/VI-compound semiconductors, it can be understood that the lattice constant of the active layer 4 made of ZnCdSe as described above is made large as compared with that of the GaAs substrate 1 in which is not made of Cd. In such structure, compressive stress is applied to the active layer.

Figure 6:
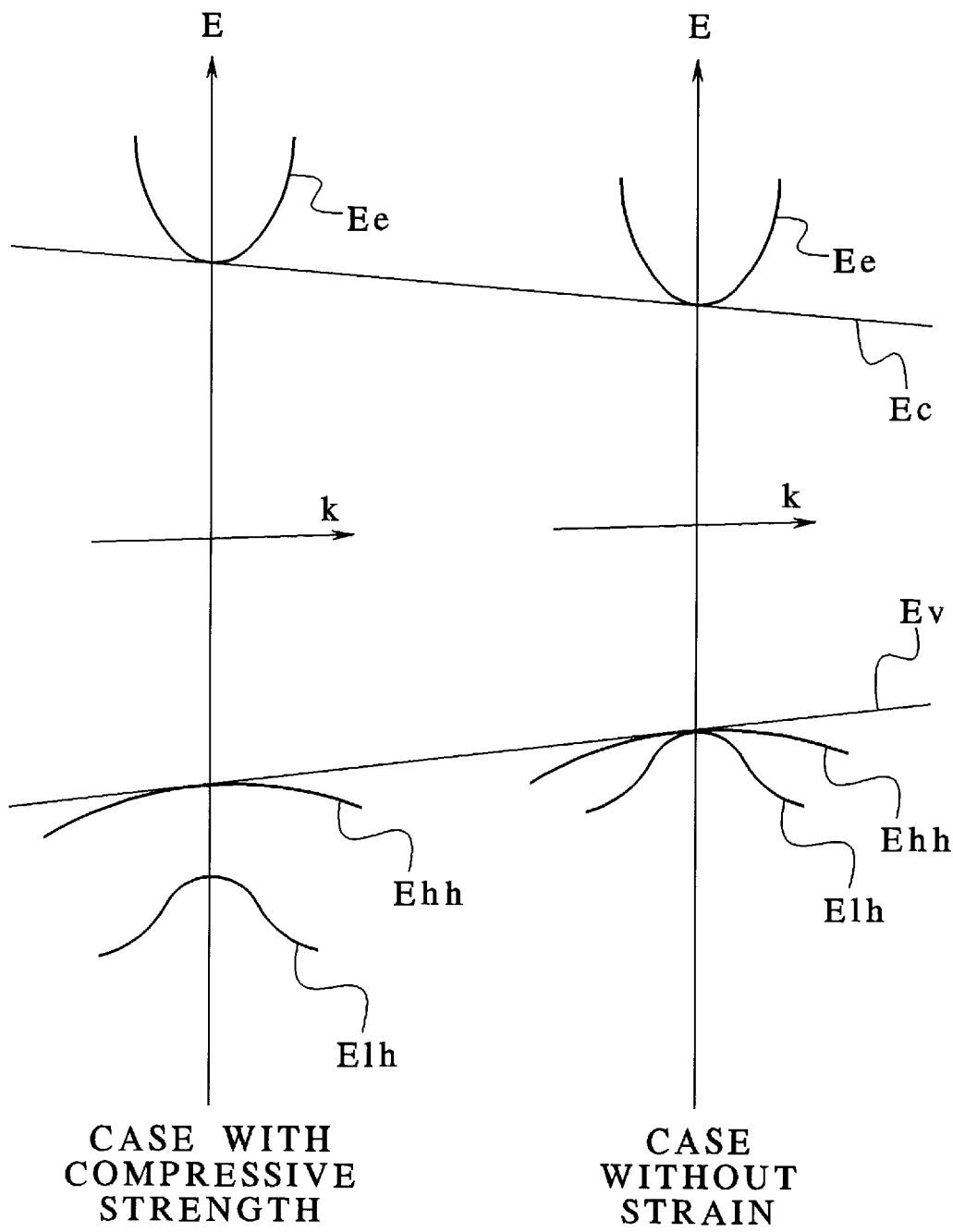
FIG. 6 is a diagram used to explain a compressive stress.

Possible physical effect caused by the compressive stress is as follows. As shown in FIG. 6 which shows energy band diagrams of a wave number k obtained when the compressive stress is applied and when strain is not produced, strain removes degeneracy between heavy holes and light holes of a valence band and the heavy holes are increased in level as compared with the light holes, i.e., an effective mass under degeneracy becomes lighter, so that an effective state density Nv $(=2 (2\pi m_h k_B T/h^2)^{3/2}$, where reference letters $m_h$, $k_B$, T and h represent a mass of the heavy hole, a Bolzmann constant, a temperature and a Planck's constant, respectively) becomes small. Therefore, population inversion of carriers between a valence band and a conduction band can be produced in the semiconductor with ease. The semiconductor laser is lowered in an oscillation threshold value and oscillated efficiently. Moreover, a wavelength of the semiconductor laser can be made shorter with ease by extending an energy band.

Another possible physical effect is as follows. A growth temperature at which the semiconductor light emitting device having the above structure is fabricated is substantially 300° C. A thermal expansion coefficient of a II/VI-epitaxial growth layer is different from that of the GaAs substrate by about $2 \times 10^{-6}$/K, and composition of the II/VI-epitaxial growth layer which is lattice-matched to the substrate while being grown is different from that obtained at room temperature. Assuming that the II/VI-epitaxial layer should be lattice-matched to the substrate while being grown, the lattice matching can be effected by setting the lattice mismatching Δa/a to Δa/a=−0.06%. Therefore, study and research reveal that the lattice mismatching Δa/a presented by the cladding layer should be selected within the range of −0.4%≦Δa/a<0% in order to improve characteristics of the semiconductor light emitting device more.

Figure 7:
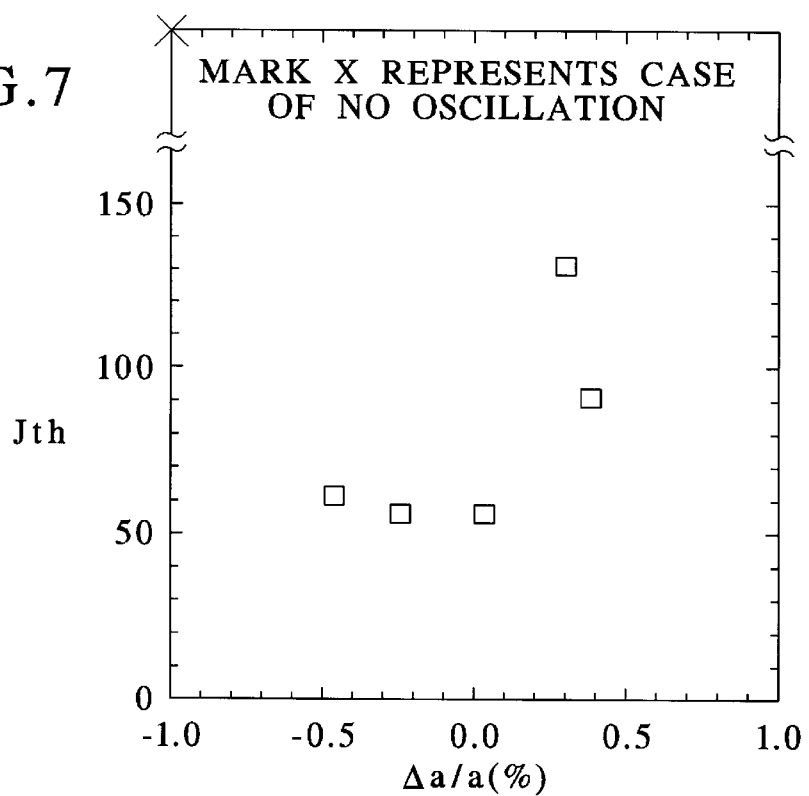
FIG. 7 is a diagram showing relation between the lattice mismatching and an oscillation threshold value.

FIG. 7 shows measured results of the oscillated situation obtained when the current threshold density Jth is plotted with respect to the lattice mismatching Δa/a in the semiconductor laser fabricated by using a device whose substrate temperature was controlled accurately. Values of the lattice mismatching Δa/a shown in FIG. 7 are those of the lattice mismatching Δa/a presented by the cladding layer of each semiconductor laser according to the inventive and comparative examples in which X-ray diffraction intensity becomes maximum as shown in FIG. 3. In order to obtain a lower oscillation threshold value, the lattice mismatching Δa/a should be selected within the range of −0.4%≦Δa/a<0%.

When strain is applied by mismatching the lattice constant of the cladding layer with that of the substrate as described above, there is the risk that deterioration of the light emitting device is quickened. However, when the lattice constant of the second cladding layer 6 deposited on the opposite side relative to the substrate is made small as compared with the lattice constant of the first cladding layer 2 on the substrate side, the lattice of the second cladding layer 6 is expanded by heat generated by the electrode at a temperature at which the semiconductor light emitting device is actually oscillated. The lattice constant of the second cladding layer 6 approximates that of the first cladding layer 2 on the substrate side and hence the strain can be decreased. Therefore, the deterioration of the semiconductor light emitting device can be suppressed and a life thereof can be more extended.

Satisfactory optical characteristics could be obtained when the first cladding layer 2 was made of a II/VI-compound semiconductor ZnMgSSe having composition which allowed the lattice mismatching $\Delta a/a$ presented by the first cladding layer 2 relative to the GaAs substrate 1 to be set to 0.5% or smaller. These characteristics was confirmed by measured results which will next be explained.

As described above, according to the present invention, a value x and a value y varied in a $Zn_xMg_{1-x}S_ySe_{1-y}$ composition of the first and second cladding layers 2, 6, more particularly, the first cladding layer 2 are selected in order to set the lattice mismatching $\Delta a/a$ presented thereby relative to the GaAs substrate 1 to ±0.5% or smaller. These values x, y are selected on the basis of the measured results shown in FIG. 8 of the lattice mismatching $\Delta a/a$ presented by the cladding layer 2 relative to the GaAs substrate and a band gap Eg obtained when the values x, y are varied in the composition $Zn_xMg_{1-x}S_ySe_{1-y}$.

Figure 8:
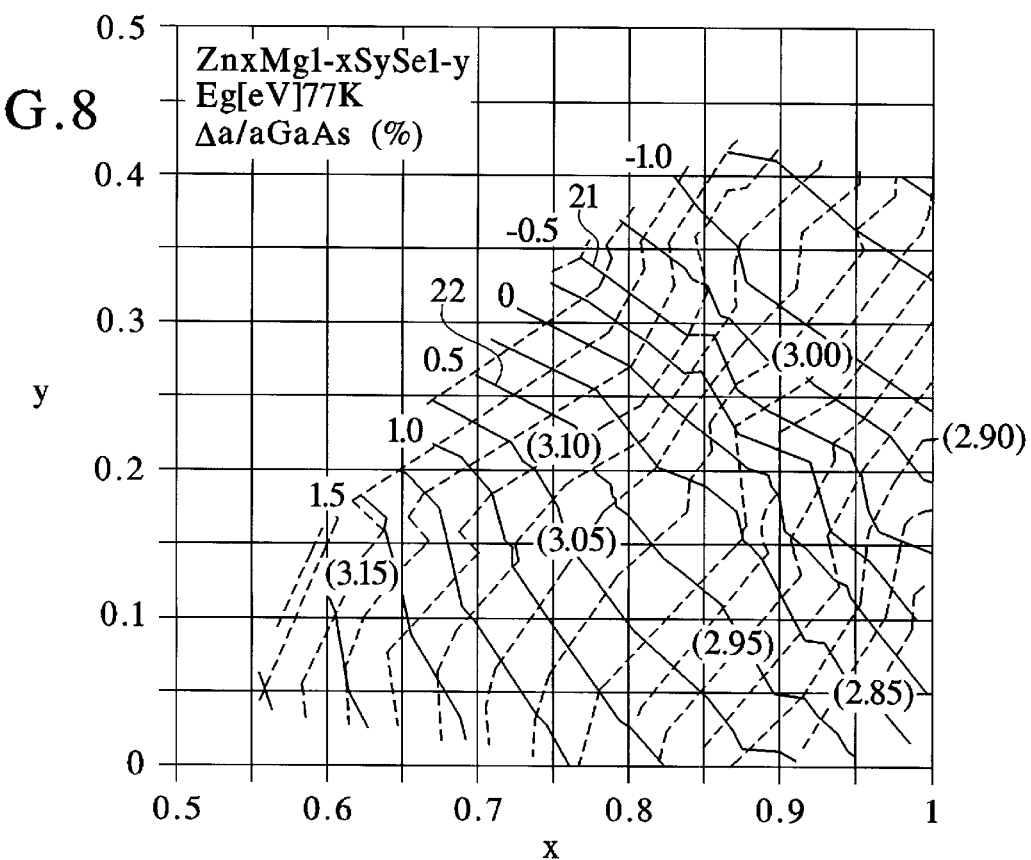
FIG. 8 is a diagram showing a composition of $Zn_xMg_{1-x}S_ySe_{1-y}$, the lattice mismatching thereof relative to a GaAs substrate and a measured result of a band gap.

As shown in FIG. 8, solid curves indicate contour lines of the lattice mismatching $\Delta a/a$ presented by the first cladding layer 2 relative to a GaAs single crystal obtained when the values x, y are varied in the composition $Zn_xMg_{1-x}S_ySe_{1-y}$. As shown in FIG. 8, values of the lattice mismatching $\Delta a/a$ are described at left edges of the respective corresponding solid curves. The curves 21 and 22 in the same figure shows the values x, y which set the lattice mismatching $\Delta a/a$ to ±0.5%, respectively. An absolute value of the lattice mismatching $\Delta a/a$ is set to 0.5% or smaller within a range on and between the solid curves 21 and 22.

According to the present invention, the values x, y varied in the composition $Zn_xMg_{1-x}S_ySe_{1-y}$ of the first cladding layer 2 are selected within the range on and between the solid curves 21 and 22 shown in FIG. 8.

As shown in FIG. 8, broken curves indicate contour lines of the band gap Eg, and each of values Eg corresponding to the broken curves is indicated with parentheses. When the values Eg shown in FIG. 8 were measured, there was used a ZnMgSSe material with its thickness of 1 $\mu$m to 2 $\mu$m which was epitaxially grown by an MBE (molecular beam epitaxy) on the GaAs single-crystal substrate with its thickness of 350 $\mu$m to 400 $\mu$m. The values Eg were obtained from a band-edge light emission at 77K obtained when there was carried out PL (photoluminescence light emission) generated by radiating and exciting a He-Cd laser light on the material.

Figure 9:
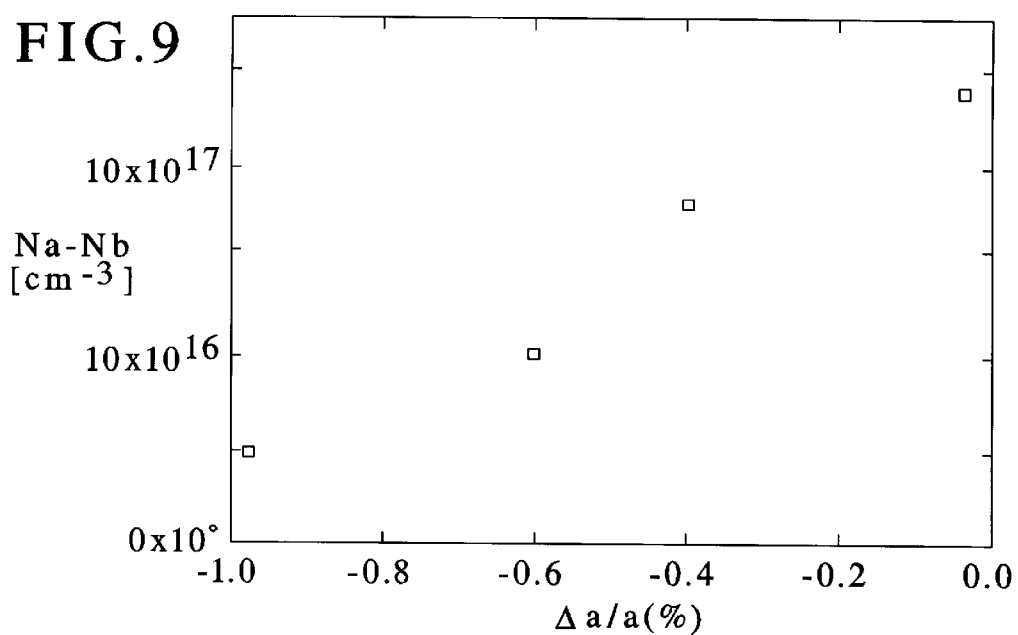
FIG. 9 is a diagram showing a measured result of the lattice mismatching $\Delta a/a$ and a carrier activating ratio.

The lattice mismatching $\Delta a/a$ and crystallinity of the material having the above structure were measured. The crystallinity was judged by measuring an activation ratio of a carrier in a ZnMgSSe epitaxial growth layer of the above material in which a p-type impurity N is doped. The activation ratio was measured with difference between an acceptor density concentration Na and a donor density concentration Nd in the material. FIG. 9 shows the measured results. As clear from FIG. 9, when the lattice mismatching $\Delta a/a$ exceeds an absolute value of 0.5%, the acceptor density concentration Na is drastically lowered. It can be understood that the activation ratio is lowered, i.e., the crystallinity is lowered.

Figure 10:
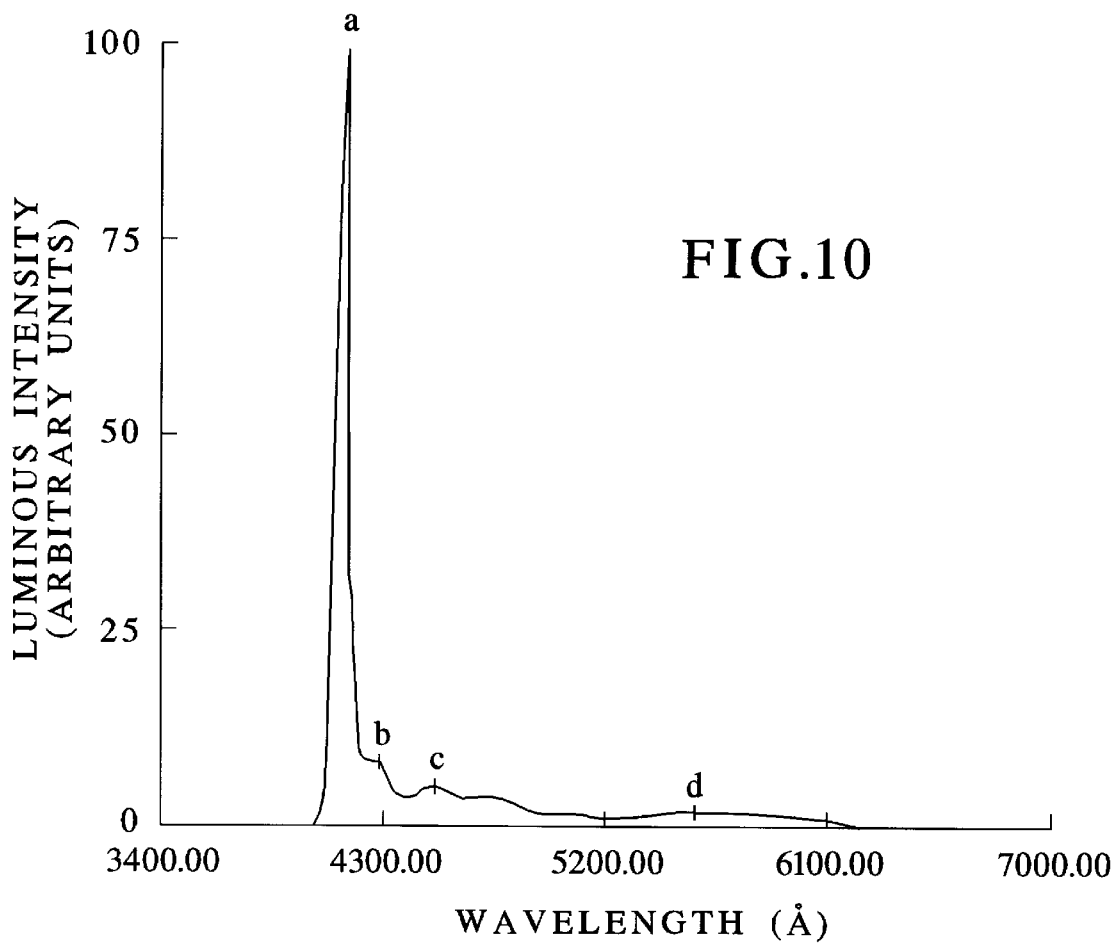
FIG. 10 is a diagram of light emission spectrum of a ZnMgSSe system PL (Photoluminescence)
Figure 11:
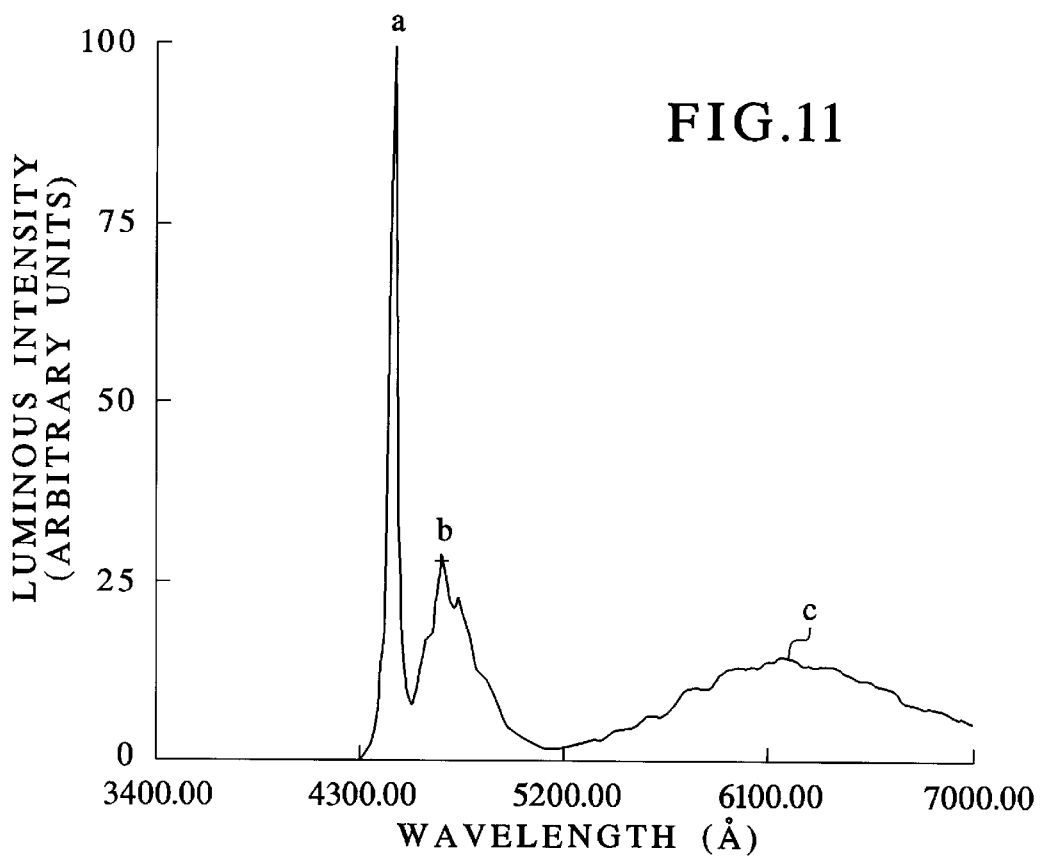
FIG. 11 is a diagram of light emission spectrum of a ZnMgSSe system PL.

FIGS. 10 and 11 show measured results of luminous characteristics at 77K of the above measured material, i.e., the PL element. FIG. 10 shows the measured results of the light emission spectrum of the above material with its lattice mismatching $\Delta a/a$ of 0.11%, and FIG. 11 shows the measured results of the light emission spectrum of the above material with its lattice mismatching $\Delta a/a$ of 0.60% which exceeds 0.5%. As shown in FIG. 10, a ratio a/d of a band-edge luminous intensity a to a luminous intensity d from a deep level indicates a high value of about 95.5, while, as shown in FIG. 11, a ratio a/c of the band-end luminous intensity a to a luminous intensity c from the deep level indicates a very small value of about 6.8.

As described above, it is evident that the smaller lattice mismatching $\Delta a/a$ is preferable. As clear particularly from FIG. 9, it can be understood that within the range of the lattice mismatching $\Delta a/a$ between ±0.5%, the semiconductor light emitting device having an excellent crystallinity and an excellent characteristic can be fabricated. Therefore, the characteristics of the semiconductor light emitting device can be further improved.

When the first cladding layer 2 was made of the II/VI-compound semiconductor ZnMgSSe which allowed the lattice mismatching $\Delta a/a$ presented thereby relative to the GaAs substrate 1 to be set within the range of $-0.1\% \leq \Delta a/a < 0\%$, luminous characteristics of a quantum well layer in the active layer were improved. Therefore, the light emitting device having more satisfactory characteristics could be obtained. These characteristics can be verified by measured results which will be explained next.

Figure 12:
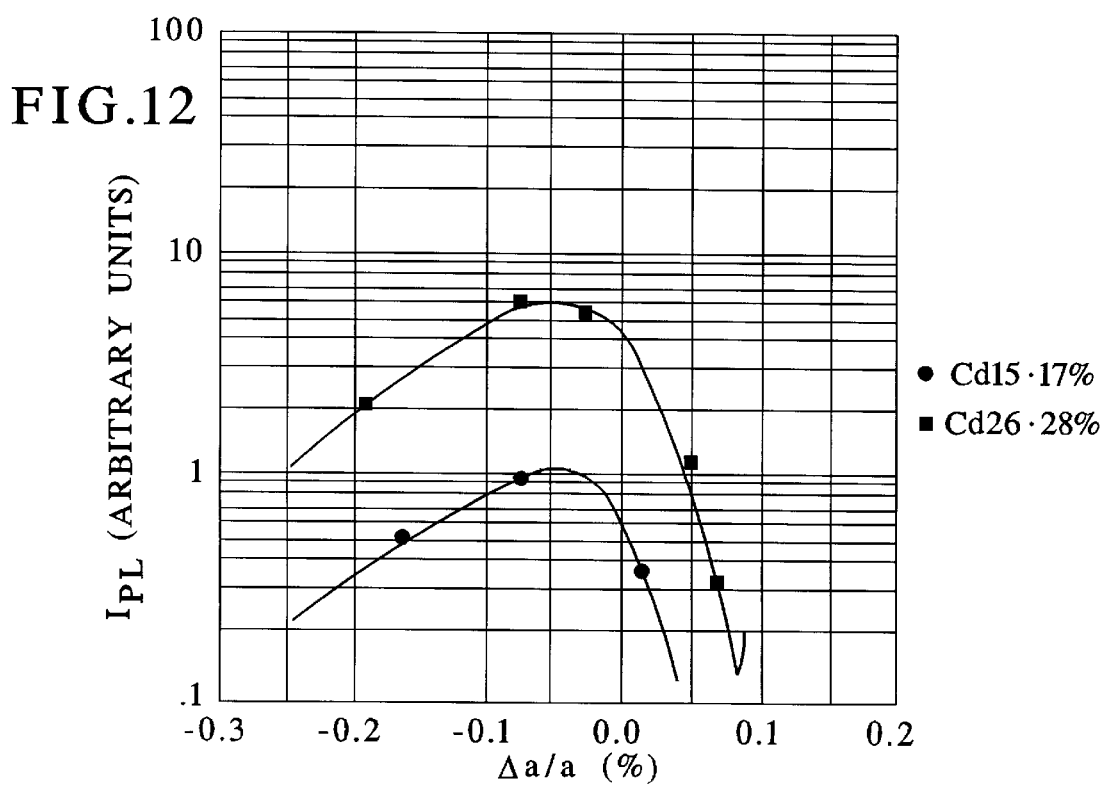
FIG. 12 is a diagram showing dependence of the luminous intensity of a ZnSSe/ZnCdSe/ZnSSe QW (quantum well) upon the lattice mismatching.

In order to examine luminous intensity at room temperature, ZnSSe, ZnCdSe and ZnSSe were successively epitaxially grown on the GaAs substrate. FIG. 12 shows the measured results of the luminous intensity from the quantum well layer and the lattice matching presented by ZnSSe relative to the GaAs substrate obtained when PL of the above material was observed at room temperature. In FIG. 12, plotted solid circle and square respectively indicate measured results obtained when amounts of Cd in the ZnCdSe were set to 15 to 17% and 26 to 28%. It is understood from FIG. 12 that a maximum luminous intensity can be obtained when the lattice mismatching $\Delta a/a$ presented by the ZnSSE guiding layers sandwiching the quantum well therebetween relative to the GaAs substrate 1 is set within the range of $-0.1\% \leq \Delta a/a < 0\%$. This structure is just the above-mentioned laser structure around the active layer. Therefore, it is desirable to set the lattice matching presented by the guiding layer relative to the substrate within the above range.

Having described the embodiments according to the present invention, the present invention is not limited to the above mentioned embodiments. It is needless to say that there can be effected various kinds of changes and modifications such as change in a material composing each layer, deposition of a buffer layer made of proper material such as ZnSe or the like between the substrate 1 and the first conductivity type cladding layer 2 in the structure shown in FIG. 1, or the like. It is also to be understood that various changes and modifications can be effected by one skilled in the art without departing from the spirit or scope of the present invention as defined in the appended claims.

We claim:

1. A method of manufacturing a semiconductor light emitting device comprising the steps of:

forming a first cladding layer, an active layer, and a second cladding layer on a substrate in this order;

wherein the first cladding layer and the second cladding layer are comprised of II–VI compound semiconductors including at least one member of the group II elements from the group consisting of Zn, Hg, Cd, Mg and at least one member of the group VI elements from the group consisting of S, Se, Te, and further wherein said step of forming the first cladding layer comprises a step of forming the cladding layer such that at a growth temperature the first cladding layer and the substrate are substantially lattice-matched at said growth temperature due to a difference in thermal expansion coefficients between the first cladding layer and the substrate, and such that they are lattice-mismatched at an ambient temperature.

2. A method of manufacturing a semiconductor light emitting device according to claim 1, wherein said substrate is a GaAs substrate, and at least one of said first cladding layer and said second cladding layer is ZnMgSSe layer.

* * * * *